United States Patent
Glenn et al.

(10) Patent No.: US 6,353,290 B1
(45) Date of Patent: Mar. 5, 2002

(54) MICROWAVE FIELD EMITTER ARRAY LIMITER

(75) Inventors: Chance Glenn, Columbia; Roger Kaul, Olney; Louis Jasper, Jr., Fulton, all of MD (US); George Bergeron, III, Springfield; Douglas A. Kirkpatrick, Great Falls, both of VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 936 days.

(21) Appl. No.: 08/611,899

(22) Filed: Mar. 6, 1996

(51) Int. Cl.$^7$ .................................................. H01J 1/16
(52) U.S. Cl. ......................... 315/3; 313/309; 313/336; 315/169.1; 361/42
(58) Field of Search .................. 315/344, 349, 315/169.1, 3; 313/309, 310, 336, 306, 351; 361/42

(56) References Cited

U.S. PATENT DOCUMENTS

| | | | |
|---|---|---|---|
| 3,746,905 A | * | 7/1973 | Shelton et al. ............... 313/309 |
| 4,721,885 A | * | 1/1988 | Brodie ..................... 313/309 X |
| 4,987,377 A | * | 1/1991 | Gray et al. ............. 313/309 X |
| 5,097,231 A | * | 3/1992 | Johnson et al. ................ 333/13 |
| 5,138,220 A | | 8/1992 | Kirkpatrick ................. 313/309 |

* cited by examiner

Primary Examiner—Justin P. Bettendorf
(74) Attorney, Agent, or Firm—Frank J. Dynda; William V. Adams

(57) ABSTRACT

An apparatus using field emission techniques to limit voltage on RF transmission lines. A voltage limiter comprises a cathode and an anode housed in an airtight tube, whereby the cathode comprises a field emitter array having a plurality of field tips distributed about the surface of an insulating layer, and a microstrip transmission line overlying the insulating layer and having a predetermined width to form electrical contact with a selected group of the field tips. The microstrip transmission line enables propagation of electromagnetic microwave energy over a bandwidth of multiple octaves. The field emitters enable the generation of a flow of electrons at a predetermined breakdown threshold voltage, without the necessity for an external source to induce electron flow. Generation of the electron flow by the field tips creates a reflection wave on the transmission line that interferes with the incident electromagnetic energy to limit the voltage on the transmission line.

18 Claims, 5 Drawing Sheets

MICROWAVE FIELD EMITTER ARRAY LIMITER

BACKGROUND OF THE INVENTION

1. Field of the Invention

The present invention relates to voltage limiters using field emission techniques to limit the voltage on radio frequency transmission lines.

2. Description of the Prior Art

Voltage limiters are used to protect delicate circuits from damage due to overvoltage caused by large voltage pulses. Conventional voltage limiters, also referred to as hardening devices, use semiconductor p-n junction devices to provide a conditional short circuit to ground. An effective hardening device, however, needs to provide extremely fast in-band limiting in order to limit the damaging effects of transient pulses.

The speed of a semiconductor device such as a metal semiconductor field effect transistor (MESFET) is limited by the time it takes for an electron to travel from the source to the drain. Impurity and phonon collisions within the lattice of the semiconductor material lead to electron velocity saturation.

Vacuum microelectronic technology has been investigated as an alternative to solid state electronics to provide more robust and higher-speed limiting. Vacuum valves have a cathode and an anode and pass electrons from the cathode to the anode uninterrupted by molecular collisions. This technique, referred to as ballistic transport, yields transit times of less than one picosecond for threshold voltages of 100 volts and dimensions on the order of 1 micrometer. However, complete switching times are impaired by parasitic capacitances, characteristic of small devices, as well as packaging capacitance.

A primary concern of any protection device is that it provides a very low impedance alternative path before the incoming transient pulse causes damage. FIG. 1 is a diagram illustrating the amount of energy supplied to a component before the protection device is turned on. The power P(t) of the transient pulse shown in FIG. 1 is not controlled by the protection device until time $t=\tau$. Thus, the component being protected suffers from spike leakage, defined as the energy $E_{spike}$ that leaks through the protection device from the time $t=0$ until the protection device is turned on at time $t=\tau$.

Existing semiconductor devices and vacuum valves have disadvantages as protection devices. Semiconductor devices typically rely on low-voltage transport in a low-density electron gas. Ionizing radiation can cause an excitation of carriers, changing the density of the electron gas, thereby leading to significant shifts in bias voltage. The result may be a transient upset, or permanent damage. Vacuum valves, however, use either a metal or highly-doped silicon cathode as the source of electrons, and therefore are more resistant to affects due to ionizing radiation. Nevertheless, vacuum valves operate at much higher voltages than semiconductors, making the vacuum valves far less sensitive to large voltage transients. Moreover, vacuum valves require an energy source, such as an electron gun or heater, to induce electron flow. Alternatively, vacuum valves may use a radioactive source such as tritium to provide seed electrons for a plasma discharge, such as disclosed in Patel et al., "Microstrip Plasma Limiter", 1989 *IEEE MTT-S International Microwave Symposium Digest*, Vol. III, pp. 879–882, Jun. 13–15, 1989, Long Beach, Calif., the disclosure of which is incorporated in its entirety by reference. However, vacuum valves using radioactive sources can be difficult to manufacture and handle under required radioactive protocols. Moreover, plasma discharges are destructive to internal components.

An improved vacuum valve was proposed in Glenn, "Preliminary Investigation into the Development of Hardening Devices Using Vacuum Microelectronics Technology," HDL-PR-92-4, dated September 1992 and distributed by the Harry Diamond Laboratories under sponsorship by the U.S. Army Research Laboratory (hereinafter "the Glenn document"), the disclosure of which is incorporated in its entirety by reference. FIG. 2A shows a plane-to-plane cathode-anode geometry in a vacuum tube limiter, whereby the cathode emits electrons by thermionic emission: electrons are thermally excited from the cathode by a heater, modulated by a grid and collected at the anode.

According to the Glenn document, improved vacuum valve limiters can be developed using field emission instead of using thermionic emission as stated above. FIG. 2B shows a point-to-plane field emitter geometry, whereby field emission tips formed on the cathode have a radii of curvature on the order of angstroms, resulting in a high electron field at the cathode surface producing a more reliable electrical breakdown.

Although the Glenn document suggests the desirability that vacuum diode limiters be compatible with microwave circuitry, the Glenn document provides no disclosure or suggestion of the necessary specifications to make such a device. Moreover, the Glenn document does not recognize whether microwave limiters can be manufactured to satisfy limitations of microwave technology and the requirements of the limiter, namely a device having a fast response time and a relatively low threshold.

DISCLOSURE OF THE INVENTION

There is a need for a limiter that provides a wide bandwidth to prevent transmission line signals having a large voltage from damaging electronic components.

There is also a need for a voltage limiter that is able to operate in the microwave frequency ranges.

There is also a need for a microwave voltage limiter having a bandwidth including several octaves at a selected microwave frequency.

There is also a need for a passive voltage limiter that operates without externally supplied heat, voltage, or radioactive sources.

There is also a need for a voltage limiter that may operate either in a vacuum or with a gaseous medium between the cathode and the anode.

These and other needs are met by the present invention, which provides a voltage limiter having a large bandwidth (DC to millimeter waves) to prevent large voltages on a transmission line from destroying sensitive electronic components. The voltage limiter of the present invention uses field emitters to generate an electron flow above a predetermined breakdown threshold voltage. The use of field emitters enables generation of an electron flow without radioactive, thermal, or electrical sources typically used to provide "seed" electrons for a plasma discharge. Moreover, the voltage limiter of the present invention may be operated with a vacuum or gas within an airtight enclosure, allowing the predetermined breakdown threshold voltage and the voltage necessary to maintain the electron flow to be adjusted to desired values.

The present invention also comprises a microstrip transmission line that enables propagation of electromagnetic microwave energy over a bandwidth of multiple octaves. The microstrip electrically contacts a selected group of the field emitters. Since the field emitters are arranged as an array having a predetermined distribution per unit area, the width of the microstrip determines the number of field emitters used in the cathode, thereby affecting the total power handling capability of the voltage limiter.

Moreover, the region or space around the field emitter array and around the microstrip transmission line has a dielectric constant; also, the field emitter array and microstrip transmission line have impedances that minimize reflections between the boundary of the microstrip and the corresponding field emitter. An insulating layer supporting the field emitters has a known dielectric constant. The region between the cathode and the anode also has a known dielectric constant. Hence, the impedance of the voltage limiter can be determined for impedance matching with a transmission line.

Thus, the present invention provides a voltage limiter that has a known impedance that can be matched with a transmission line for voltages below the predetermined breakdown threshold voltage. If electromagnetic energy on the transmission line exceeds the predetermined breakdown threshold voltage of the dielectric medium between the selected group of field tips and the anode, the impedance of the voltage limiter is substantially reduced and an electron flow is formed between the selected group of field emitters and the anode, creating a reflection wave that interferes with the electromagnetic energy on the transmission line.

Thus, the voltage limiter of the present invention provides rapid response to high voltages for microwave signals on a transmission line over a multiple octave bandwidth, with sufficient flexibility to adjust the predetermined breakdown threshold voltage and the electron flow.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BEST MODE FOR CARRYING OUT THE INVENTION

The field emitter array limiter of the present invention is preferably implemented as a microstrip limiter having a cathode and an anode within an envelope, whereby the cathode includes a field emitter array having a plurality of field tips, and a microstrip forming a transmission line and contacting at least a selected group of the field tips.

Figure 1:
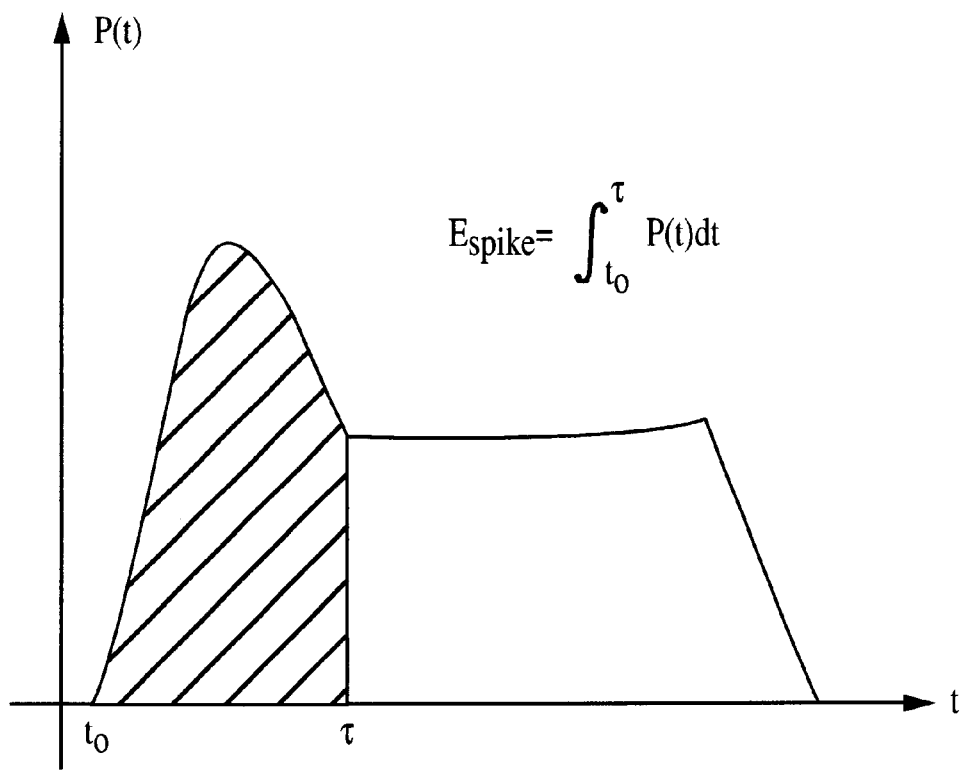
FIG. 1 is a diagram illustrating the power-time profile of a transient voltage signal on a transmission line before and after activation of a conventional (prior art) voltage limiter.
Figure 2A:
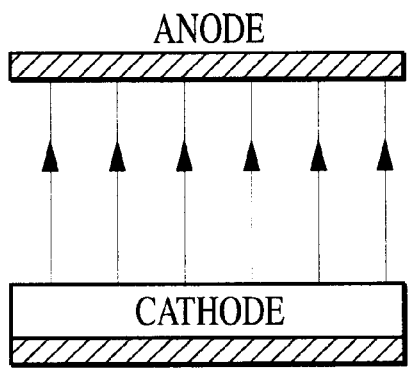
FIGS. 2A and 2B are diagrams of (prior art) vacuum limiters having a plane-to-plane cathode-anode geometry and a field emitter-to-plane geometry, respectively.
Figure 2B:
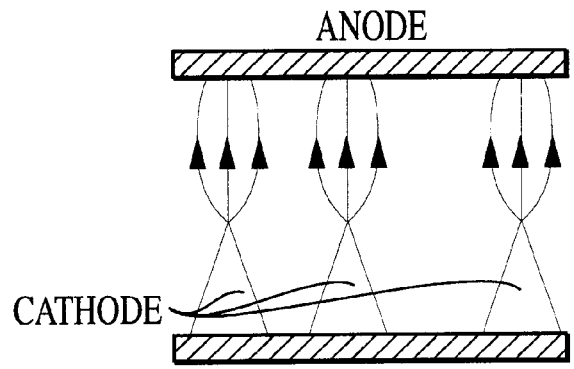
Figure 3:
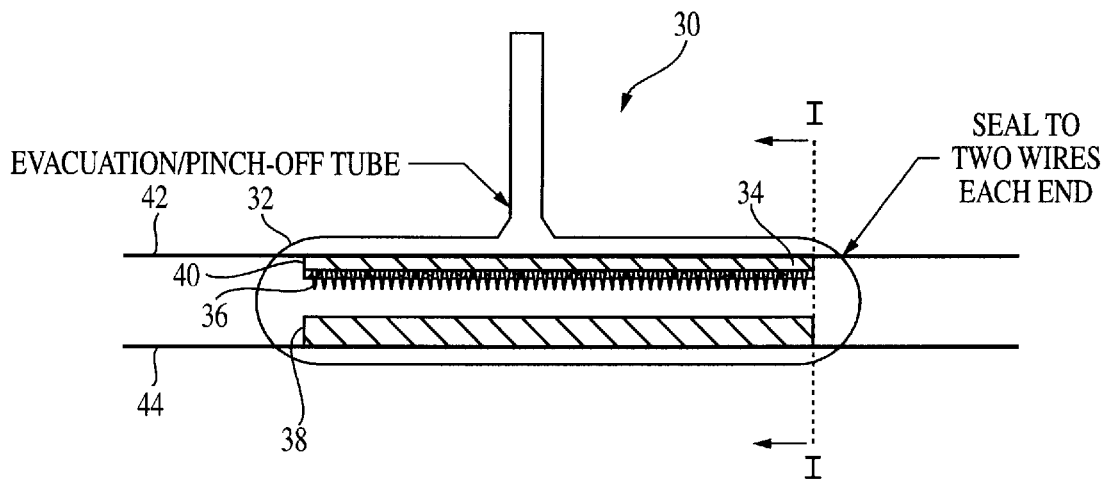
FIG. 3 is a diagram of the voltage limiter according to a preferred embodiment of the present invention.

FIG. 3 is a side view of the field emitter limiter 30 in a microstrip configuration according to a preferred embodiment of the present invention. The field emitter limiter 30 includes a vacuum envelope 32 housing a cathode 34 comprising a field emitter array having a plurality of emitters 36 (shown as short vertical lines), also referred to as field tips, spaced from an anode 38 serving as a conducting ground plane and formed of, for example, copper. The cathode 34 also comprises a microstrip transmission line 40, coupled to a selected group of the emitters 36, that propagates the electromagnetic energy through the field emitter limiter 30. Lead wires 42 and 44 exiting the envelope 32 connect the cathode 34 and the anode 38 to a transmission line circuit (not shown).

Figure 4:
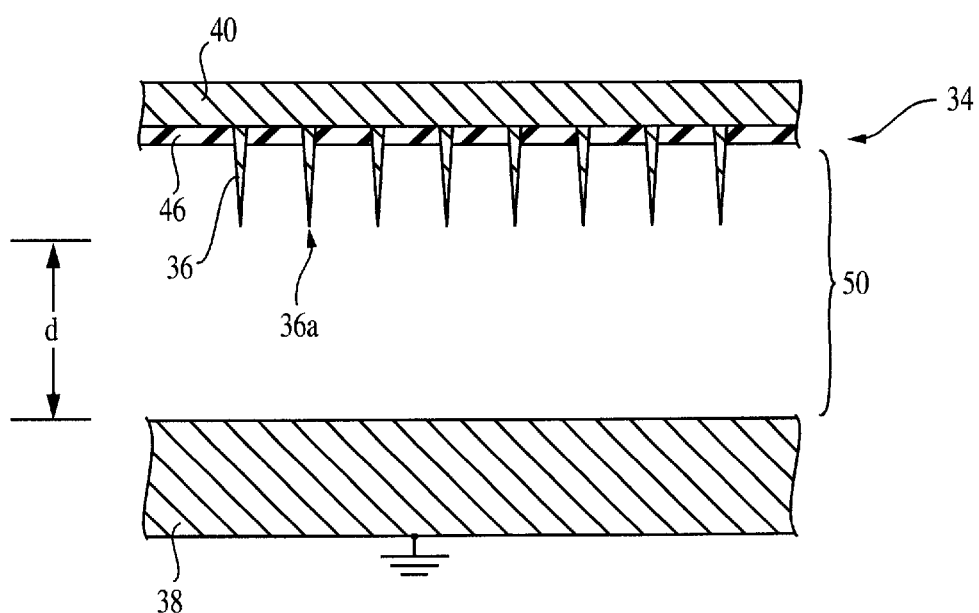
FIG. 4 is an enlarged view of the voltage limiter of FIG. 3 showing in detail the cathode and anode structures.

FIG. 4 is an enlarged view (not to scale) of the cathode 34 and the anode 38 showing in detail the microstrip transmission line 40 and the emitters 36. The field emitter comprises a plurality of field tips 36 distributed about the surface of an insulating layer 46 and having a predetermined density per unit area. The microstrip transmission line 40, preferably formed of Ti—Ni—Au, has a predetermined width such that the microstrip transmission line 40 comes into electrical contact with the field tips corresponding to the area of the field emitter covered by the microstrip transmission line 40.

The field emitter limiter is initially configured as a microstrip device analogous to a diode. The electrons are emitted from the field tips due to a high electric field at the tip 36a that reduces the potential energy barrier and allows the electrons to flow to the anode 38 when the potential difference between the tip 36a and the anode 38 (the predetermined breakdown threshold voltage) is overcome. Thus, the use of the field emitter array having the field tips 36 enables the field emitter limiter 30 to operate at room temperature without the need of an external energy source to induce electron flow, such as an electrical or radioactive source. Use of the field emitter array enables discharge of electron current densities on the order of 500 A/cm$^2$.

Figure 5:
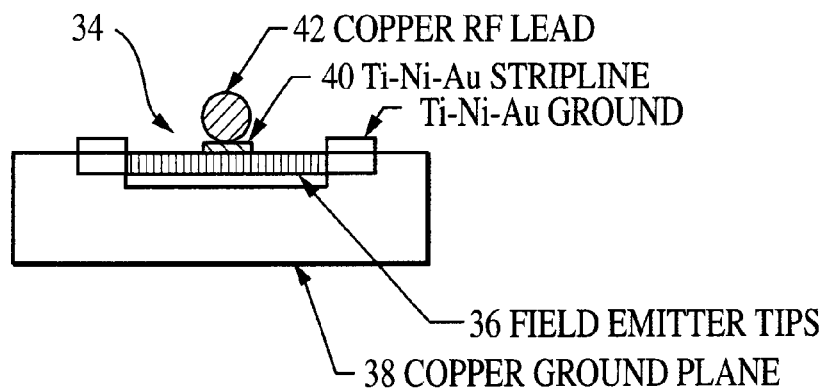
FIG. 5 is an cross-sectional view taken along line I—I of FIG. 3.
Figure 6:
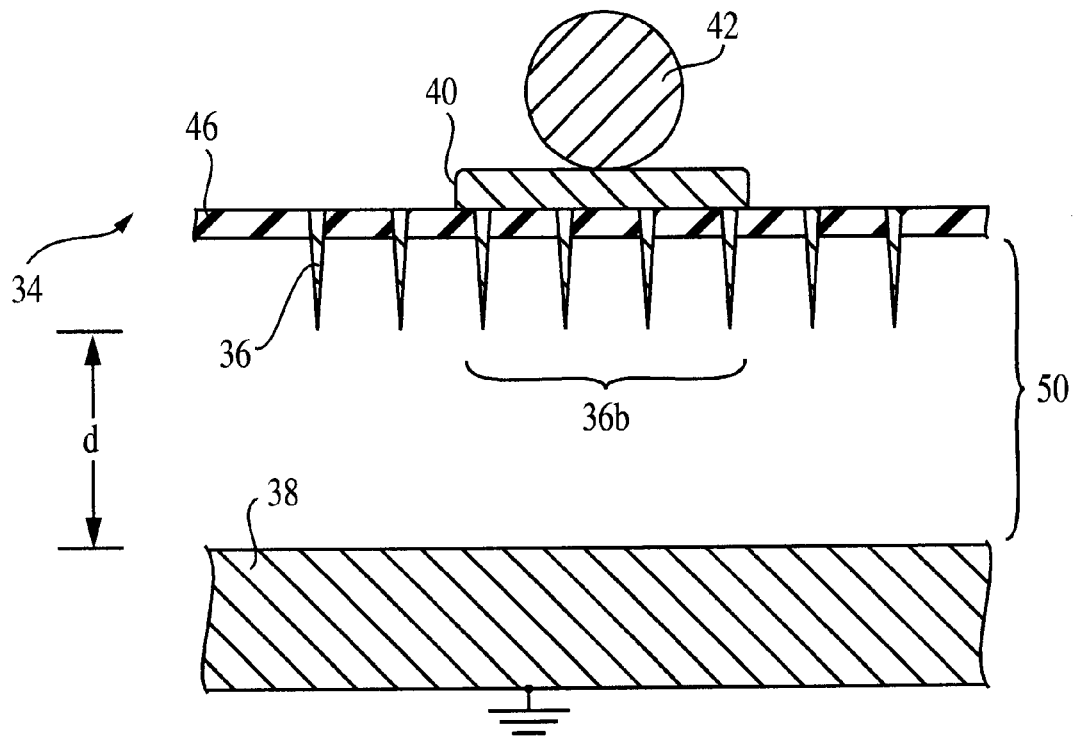
FIG. 6 is an enlarged view of FIG. 5 showing in detail the cathode and anode structures.

FIG. 5 shows the cross-sectional end view of the voltage limiter of FIG. 3 along lines I—I. The copper RF lead 42 contacts the microstrip transmission line 40, which in turn contacts field emitter tips 36 under the microstrip transmission line 40. As shown in FIG. 6, Schottky barriers between the field emitter tips 36b and the insulating layer 46, preferably formed of insulating or high resistivity silicon, isolate each field emitter tip 36. Thus, only those tips contacted by the metal microstrip 40 are active in the limiter.

The impedance of the field emitter limiter 30 is based on: the width of the microstrip transmission line 40, the dimensions of the field tips 36, the properties of the semi-insulating or insulating layer 46, and the medium 50 between the cathode 34 and the anode 38; and the spacing d of the tips between the cathode 34 and the anode 38. The field tips 36 are formed of a conducting material, such as tantalum silicide ($TaSi_2$). An exemplary method for forming the field emitter array comprising the insulating layer 46 and the field tips 36 is disclosed in U.S. Pat. No. 5,138,220, the disclosure of which is incorporated in its entirety by reference.

Thus, the microstrip transmission line 40 determines which field emitter tips 36b are active in the array. As the width of the microstrip transmission line 40 is increased, a larger number of field tips 36b become active, thereby reducing the transmission line's impedence and increasing the power handling capability of the voltage limiter. Thus, the predetermined breakdown threshold voltage is adjustable based on the width of the microstrip transmission line 40.

The current density of the emission is predicted by the Fowler-Nordheim equation. The predetermined breakdown threshold voltage can also be adjusted by varying the length of the field tips 36 and/or the spacing d shown in FIG. 4, by changing the medium 50, and by changing the distribution density per unit area of the field tips 36. The transit time for electrons from the cathode 34 to anode 38 is fractions of a picosecond, so that the device will have a high frequency response to high voltage transients.

As the electromagnetic energy passing through the microstrip transmission line 40 exceeds the predetermined breakdown threshold voltage of the medium 50, the electrons at the tip 36b form a low impedance shunt across the transmission line. Depending on the shunt's impedance upon breakdown, the low impedance shunt created in the field emitter limiter 30 creates a standing wave on the line that reflects a majority of the energy in the incident wave on the line. Thus, when the cathode-to-anode voltage is high enough to initiate an electron flow from the field tips 36b, the incident wave is reflected and the device acts as a limiter. Moreover, since no plasma (containing positive ions or holes) is generated, there is no damage to the tips 36.

Figure 7:
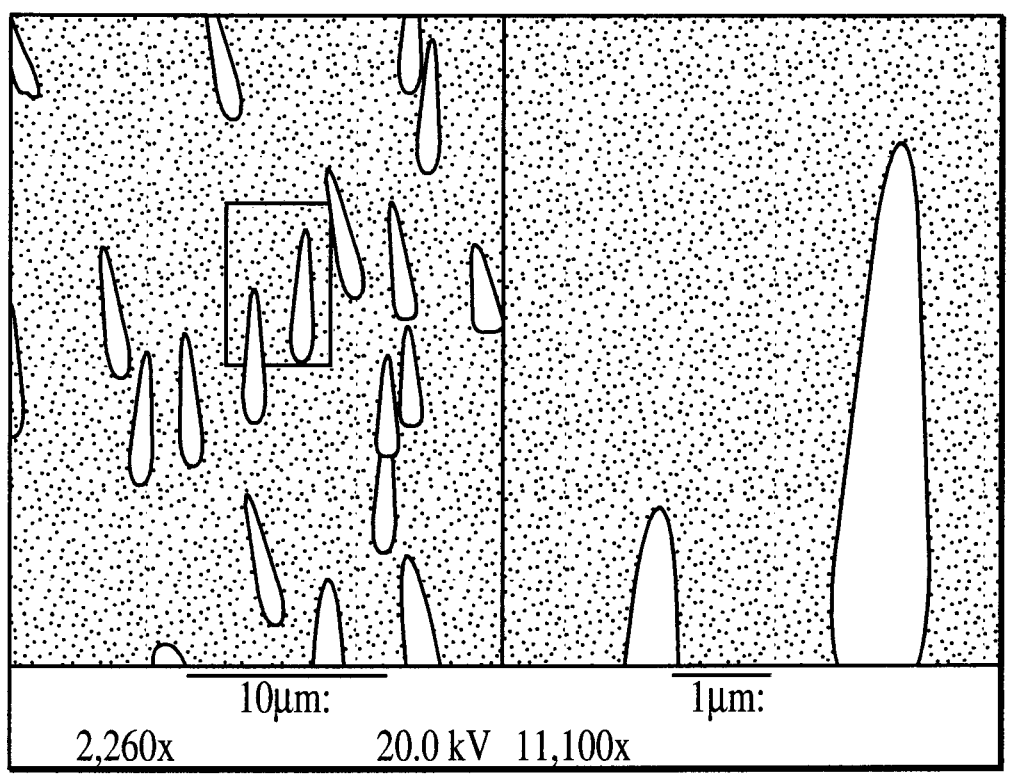
FIG. 7 is a composite of two scanning electron micrographs of the field tips of the preferred embodiment.

The field emitter array preferably comprises a silicon insulating layer 46 and tips 36 formed of tantalum silicide ($TaSi_2$) embedded in the Si. The sharpened conductors ($TaSi_2$ rods) are fabricated with a selective etching technique. FIG. 7 is a composite of two scanning electron micrographs of the tips 36 formed of $TaSi_2$ and embedded in the insulating layer 46.

The width of the cathode and the spacing between the cathode and anode form a microstrip transmission line with a vacuum or gaseous dielectric. Design equations for these transmission lines to determine the microstrip width and the spacing of the medium 50 are readily available in the art, for example from E. Wolff and R. Kaul (eds.), *Microwave Engineering and Systems Applications*, J. Wiley & Sons, Inc., New York, 1988; and T. C. Edwards, *Foundations for Microstrip Circuit Design*, J. Wiley & Sons, Inc., New York, 1981, the disclosures of which are incorporated in their entirety by reference.

Figure 8:
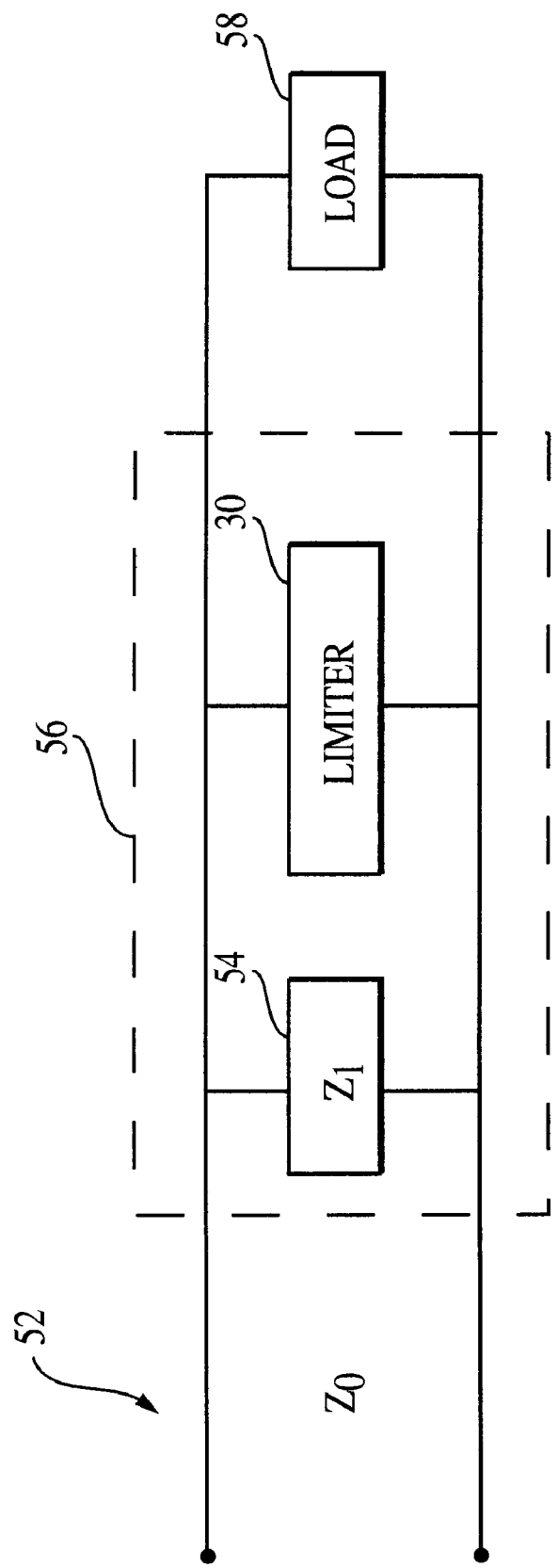
FIG. 8 is a diagram of the voltage limiter of the present invention implemented in a transmission line.

FIG. 8 is a diagram of the voltage limiter 30 implemented in a transmission line 52 having an impedance value $Z_0$, for example 50 ohms. As described above, the impedance of the field emitter limiter 30 is based upon various factors including the width of the microstrip transmission line 40, etc. Further, it is desirable if the voltage limiter matches the impedance $Z_0$ (typically 50 ohms) of the transmission line 52. If it is determined that the impedance of the limiter 30 is, for example, 75 ohms when not operating, then an impedance load 54 would be added having a value of $Z_1$=150 ohms in order to provide a voltage limiting system 56 having an equivalent matching impedance to the 50 ohm transmission line 52. The system 56 would then be used to protect the load 58 from over voltage. As recognized in the art, actual placement of the limiter 30 may be dependent upon the relative location of the load 58 based on wavelength, as recognized in transmission line theory.

As recognized in the art, the field emitter limiter 30 has a multi-octave bandwidth because it operates in the transverse electromagnetic field mode similar to a microstrip transmission line.

Since the field emitter limiter 30 conducts current when the cathode potential is negative with respect to the anode, the potential in both polarities is preferably limited by introducing a gas whose recombination time is longer than ½ the period of the voltage being limited. Any bandwidth limiting elements in the circuit will tend to cause ringing and the limiter will conduct on alternate half-cycles thus dissipating the energy in the high voltage.

The present invention is described in the context of a single microstrip in combination with a single field emitter array. Nevertheless, alternate configurations may be used. For example, two field emitters arranged in a stripline (sometimes called tri-plate) configuration may be used for dual polarity, low-power operation.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A voltage limiter comprising:
   a cathode including:
   (a) a field emitter array having an insulating layer and a plurality of field tips distributed about the surface of the insulating layer and each field tip having a proximal end passing through the insulating layer and a distal end at substantially a predetermined distance from the surface of the insulating layer, and
   (b) a microstrip transmission line overlying the insulating layer and having a predetermined width causing electrical contact with a selected group of said field tips at the proximal end thereof; and
   an anode having a first distance from the surface of the insulating layer and a second distance from the distal ends of said field tips.

2. A limiter as in claim 1, further comprising:
   an airtight tube housing said cathode and anode; and
   first and second lead wires connected to said microstrip transmission line and said anode, respectively.

3. A limiter as claim 2, further comprising a vacuum between said cathode and said anode.

4. A limiter as in claim 2, wherein said first wire is electrically connected to the length of said microstrip transmission line.

5. A limiter as in claim 1, wherein said insulating layer is formed of silicon and said field tips are formed of tantalum silicide.

6. A limiter as in claim 1, wherein said anode is a conducting ground plane.

7. A limiter as in claim 1, wherein the selected group of field tips generate an electron flow at a predetermined breakdown threshold voltage, said anode generating a reflection wave in response to the generated electron flow.

8. A limiter as in claim 7, wherein electromagnetic energy generating said electron flow and said reflection wave travels through said cathode via said microstrip transmission line and said selected group of field tips.

9. A limiter as in claim 1, wherein a region surrounding said field emitter array and said microstrip transmission line has a first dielectric constant and said insulating layer has a second dielectric constant.

10. A limiter as in claim 9, further comprising an airtight structure housing a region between said cathode and anode, said region having a third dielectric constant.

11. A limiter as in claim 10, wherein the limiter has a first impedance determined on the basis of said predetermined width of said microstrip transmission line, said selected group of field tips, said insulating layer, and said region.

12. A limiter as in claim 11, wherein said limiter has a second impedance generating a reflected wave when incident electromagnetic energy passing through said microstrip transmission line exceeds a threshold voltage.

13. A limiter as in claim 12, further comprising means for matching said first impedance with an impedance of a transmission line carrying said incident electromagnetic energy.

14. A voltage limiter for a radio frequency transmission line comprising:

a cathode comprising:
- (a) a microstrip transmission line having a predetermined width and dielectric constant,
- (b) an array of field tips having a predetermined distribution density per unit area and a dielectric constant matching the dielectric constant of said microstrip transmission line, said microstrip transmission line contacting proximal ends of a group of the field tips based on the predetermined width, and
- (c) an electrically-insulating support supporting said array; and
  an anode surface a predetermined distance from the distal ends of said group of field tips;

wherein the limiter and said radio frequency transmission line have matching impedances for electromagnetic energy below a predetermined breakdown threshold voltage.

15. A limiter as in claim 14, further comprising:

an airtight tube housing said cathode and anode; and first and second lead wires connected to said microstrip transmission line and said anode, respectively.

16. A limiter as in claim 14, wherein the group of the field tips generate an electron flow at the predetermined breakdown threshold voltage, the anode surface generating a reflection wave on the transmission line in response to the generated electron flow.

17. A limiter as in claim 14, wherein the limiter has a second impedance substantially lower than the impedance of the radio frequency transmission line when the electromagnetic energy passing through the radio frequency transmission line is above the predetermined breakdown threshold voltage.

18. A limiter as is claim 14, wherein the cathode and anode surface form a first impedance, the limiter further comprising an impedance matching load having a second impedance, the first and second impedances forming the matching impedance with the transmission line when operated below the predetermined breakdown threshold voltage.

* * * * *